United States Patent
Usui

(10) Patent No.: US 7,939,951 B2
(45) Date of Patent: May 10, 2011

(54) MOUNTING SUBSTRATE AND ELECTRONIC APPARATUS

(75) Inventor: Hirotoshi Usui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 89 days.

(21) Appl. No.: 12/526,242

(22) PCT Filed: Jan. 29, 2008

(86) PCT No.: PCT/JP2008/051250
§ 371 (c)(1),
(2), (4) Date: Aug. 6, 2009

(87) PCT Pub. No.: WO2008/096633
PCT Pub. Date: Aug. 14, 2008

(65) Prior Publication Data
US 2010/0314770 A1   Dec. 16, 2010

(30) Foreign Application Priority Data

Feb. 7, 2007   (JP) ................................. 2007-027953

(51) Int. Cl.
*H01L 21/31*   (2006.01)
*H01L 21/469*   (2006.01)
(52) U.S. Cl. ........................................ 257/784; 257/786
(58) Field of Classification Search .................. 257/786, 257/784, 701
See application file for complete search history.

(56) References Cited

U.S. PATENT DOCUMENTS

| | | | | |
|---|---|---|---|---|
| 5,952,726 A * | 9/1999 | Liang | ............................. | 257/778 |
| 6,118,177 A | 9/2000 | Lischner et al. | | |
| 6,285,560 B1 * | 9/2001 | Lyne | ............................. | 361/760 |
| 6,800,930 B2 * | 10/2004 | Jackson et al. | ................ | 257/700 |
| 6,831,234 B1 | 12/2004 | Asai et al. | | |
| 7,129,574 B2 * | 10/2006 | Wu | ............................... | 257/691 |
| 7,538,442 B2 * | 5/2009 | Nakanishi et al. | ............ | 257/786 |
| 2006/0042828 A1 | 3/2006 | Matsuo | | |
| 2009/0127721 A1 * | 5/2009 | Isono | ............................ | 257/786 |

FOREIGN PATENT DOCUMENTS

| | | |
|---|---|---|
| JP | 10-013026 A | 1/1998 |
| JP | 11-260956 A | 9/1999 |
| JP | 2000-150735 A | 5/2000 |
| JP | 2006-066753 A | 3/2006 |

* cited by examiner

Primary Examiner — S. V Clark
(74) Attorney, Agent, or Firm — Rabin & Berdo, PC

(57) ABSTRACT

A mounting substrate having a structure allowing reduction of the cost and an electronic apparatus formed by surface-mounting a semiconductor device thereon are provided. The mounting substrate is a mounting substrate mounted with a semiconductor device having external terminals alignedly arrayed in the form of a matrix, and includes junctions arrayed on a surface to which the semiconductor device is opposed so that the external terminals are bonded thereto respectively and wires connected to the junctions respectively and extracted out of a region to which the semiconductor device is bonded. The wires connected to inwardly arrayed 4 rows by n columns (n: integer of not less than 5) of the junctions respectively are formed on a first wiring layer. The wires connected to the junctions set in two annular arrays surrounding the outer sides of the 4 rows by n columns of junctions respectively are formed on a second wiring layer different from the first wiring layer.

2 Claims, 4 Drawing Sheets

MOUNTING SUBSTRATE AND ELECTRONIC APPARATUS

TECHNICAL FIELD

The present invention relates to a mounting substrate surface-mounted with a semiconductor device, and an electronic apparatus formed by surface-mounting a semiconductor device on the mounting substrate.

PRIOR ART

For example, a BGA (Ball Grid Array) package is known as a typical package (a surface mounting package) enabling surface mounting of a semiconductor device.

In a semiconductor device employing a BGA package, ball-shaped external terminals are alignedly arrayed in the form of a square matrix on a surface opposed to a mounting substrate. Correspondingly thereto, lands connected with the external terminals respectively are alignedly arrayed in the form of a square matrix on the mounting substrate. On a mounting substrate (a mounting substrate for 100 pins) mounted with a semiconductor device including 100 external terminals, for example, 100 lands are alignedly arrayed in the form of a square matrix with 10 rows and 10 columns correspondingly to the 100 external terminals. Wires for supplying an operating voltage for the semiconductor device and transmitting/receiving various signals are connected to the lands respectively. The wires are extracted out of a region of the mounting substrate to which the semiconductor device is bonded, and connected to a power supply circuit or the like provided on the mounting substrate.

In a mounting substrate for 100 pins provided at present, rectangular lands L of 0.2 mm square are arranged in a row direction and a column direction at intervals of 0.5 mm, for example, as shown in FIG. 7. The space between each pair of lands L adjacent to each other in the row direction or the column direction has a small width of 0.3 mm due to such arrangement of the lands L, and only one wire can be passed through the space between the wires connected to the lands L. Therefore, only wires connected to lands L forming two annular arrays can be formed on the same surface (one wiring layer). Therefore, the wires connected to the lands L respectively are dividedly formed on a plurality of wiring layers. More specifically, wires connected to the lands L (hatched with rightwardly directed slants in FIG. 7) forming two outermost annular arrays, wires connected to the lands L (hatched with leftwardly directed slants in FIG. 7) forming two annular arrays inside the same and wires connected to the four central lands L (unhatched in FIG. 7) are formed on different wiring layers respectively.

Patent Document 1: Japanese Unexamined Patent Publication No. 2000-150735

DISCLOSURE OF THE INVENTION

Problems to be Solved

However, the mounting substrate of such a multilayer interconnection structure has such a problem that the cost is increased as the number of layers is increased.

Accordingly, an object of the present invention is to provide a mounting substrate having a structure allowing reduction of the cost and an electronic apparatus formed by surface-mounting a semiconductor device thereon.

Solutions to the Problems

The invention according to claim 1 for attaining the object is a mounting substrate mounted with a semiconductor device having external terminals alignedly arrayed in the form of a matrix, including: junctions arrayed on a surface to which the semiconductor device is opposed so that the external terminals are bonded thereto respectively; and wires connected to the junctions respectively and extracted out of a region to which the semiconductor device is bonded, wherein the wires connected to inwardly arrayed 4 rows by n columns (n: integer of not less than 5) of the junctions respectively are formed on a first wiring layer, and the wires connected to the junctions set in two annular arrays surrounding the outer sides of the 4 rows by n columns of junctions respectively are formed on a second wiring layer different from the first wiring layer.

The invention according to claim 2 is an electronic apparatus including a mounting substrate and a semiconductor device having external terminals alignedly arrayed in the form of a matrix and surface-mounted on the mounting substrate, wherein the mounting substrate includes: junctions arrayed on a surface to which the semiconductor device is opposed so that the external terminals are bonded thereto respectively; and wires connected to the junctions respectively and extracted out of a region to which the semiconductor device is bonded, the wires connected to inwardly arrayed 4 rows by n columns (n: integer of not less than 5) of the junctions respectively are formed on a first wiring layer, and the wires connected to the junctions set in two annular arrays surrounding the outer sides of the 4 rows by n columns of junctions respectively are formed on a second wiring layer different from the first wiring layer.

In the mounting substrate, the wires connected to the inwardly arrayed 4 rows by n columns of junctions included in the junctions alignedly arrayed in the form of a matrix can be formed on one wiring layer (a first wiring layer), by passing the wires connected to the inner junctions arrayed at least in 2 rows by (n−2) columns respectively through the spaces between the wires connected to the junctions arrayed in the outer rows of the 4 rows respectively. The wires connected to the junctions set in the two annular rows surrounding the outer sides of the 4 rows by n columns of junctions respectively can be formed on one wiring layer (a second wiring layer), by passing the wires connected to the junctions set in the inner array of the two annular arrays respectively through the spaces between the wires connected to the junctions set in the outer array respectively.

When the junctions are arrayed in the form of a matrix with 8 rows and 13 columns, for example, wires connected to inwardly arrayed 4 rows by 9 columns of the junctions are formed on the first wiring layer, and the wires connected to the junctions set in the two outer annular arrays are formed on the second wiring layer. Therefore, only two wiring layers may be required for forming the wires connected to the 104 junctions. As hereinabove described, the conventional mounting substrate for 100 pins requires at least three wiring layers, and hence the number of the wiring layers can be reduced in the mounting substrate according to the present invention as compared with the conventional mounting substrate for 100 pins. In a mounting substrate having a multilayer interconnection structure, the cost is increased as the number of wiring layers is increased, and hence the cost for the mounting substrate can be reduced by reducing the number of wiring layers.

The foregoing and other objects, features and effects of the present invention will become more apparent from the following detailed description of the embodiments with reference to the attached drawings.

Figure 1:
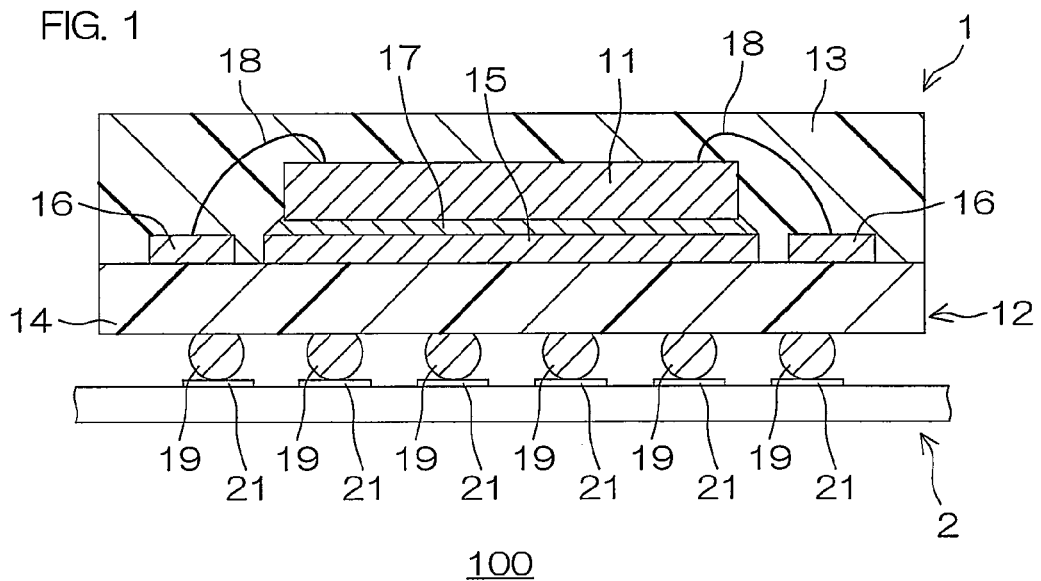
FIG. 1 is a sectional view schematically showing the structure of an electronic apparatus according to an embodiment of the present invention.

DESCRIPTION OF THE REFERENCE NUMERALS 1 semiconductor device
2 mounting substrate
19 external terminal
21 land (junction)
22 insulating layer
23 front wiring layer
24 rear wiring layer
25 wire
28 wire
100 electronic apparatus

BEST MODE FOR CARRYING OUT THE INVENTION

An embodiment of the present invention is now described in detail with reference to the attached drawings.

FIG. 1 is a sectional view schematically showing the structure of an electronic apparatus according to the embodiment of the present invention.

An electronic apparatus 100 has a structure formed by surface-mounting a surface mounting type semiconductor device 1 on a mounting substrate 2.

The semiconductor device 1 includes a semiconductor chip 11, an interposer 12 loaded with the semiconductor chip 11 and sealing resin 13 sealing the semiconductor chip 11.

The semiconductor chip 11 includes a timing control circuit connected to a driver for a liquid crystal display, for example. The outermost surface of the semiconductor chip 11 is covered with a surface protective film, and a plurality of pads (not shown) are provided on the peripheral edge portion thereof in a state exposed from the surface protective film.

The interposer 12 includes an insulating substrate 14 made of insulating resin (glass epoxy resin, for example).

On a first surface (the upper surface) of the insulating substrate 14, an island 15 in the form of a thin rectangular plate having a size slightly larger than that of the semiconductor chip 11 in plan view is formed on the central portion. On the first surface of the insulating substrate 14, further, a plurality of internal terminals 16 are formed on a peripheral edge portion surrounding the island 15. The island 15 and the internal terminals 16 are made of a metal such as copper, for example, and have conductivity.

The rear surface of the semiconductor chip 11 is bonded to the island 15 through a bonding agent 17 made of high-melting solder (solder having a melting point of not less than 260° C.), for example. Each internal terminal 16 is connected (wire-bonded) to each pad on the surface of the semiconductor chip 11 through a bonding wire 18 made of a thin gold wire, for example. Thus, the rear surface of the semiconductor chip 11 is electrically connected with the island 15 through the bonding agent 17, and an internal circuit (not shown) thereof is electrically connected with the internal terminals 16 through the bonding wires 18.

A plurality of external terminals 19 are alignedly arrayed on a second surface (the lower surface) of the insulating substrate 14. Each external terminal 19 is formed into a ball with a metallic material such as solder, for example. The internal terminals 16 and the external terminals 19 are electrically connected with one another by vias passing through the insulating substrate 14 in the thickness direction. The vias are formed by forming via holes passing through the insulating substrate 14 and filling up the via holes with a metallic material (copper, for example), for example.

Lands 21 to which the external terminals 19 are connected respectively are arranged on the mounting substrate (a printed wiring board) 2 mounted with the semiconductor device 1 correspondingly to the external terminals 19 provided on the semiconductor device 1. The semiconductor device 1 is surface-mounted on the mounting substrate 2 by connecting the external terminals 19 to the lands 21 on the mounting substrate 2 respectively. The internal terminals 16 provided on the first surface of the insulating substrate 14 and the external terminals 19 provided on the second surface thereof are electrically connected with one another, whereby electrical connection between the lands 21 and the internal terminals 16 can be achieved by connecting the external terminals 19 to the lands 21 on the mounting substrate 2, and hence electrical connection between the lands 21 and the semiconductor chip 11 can be achieved.

Figure 2:
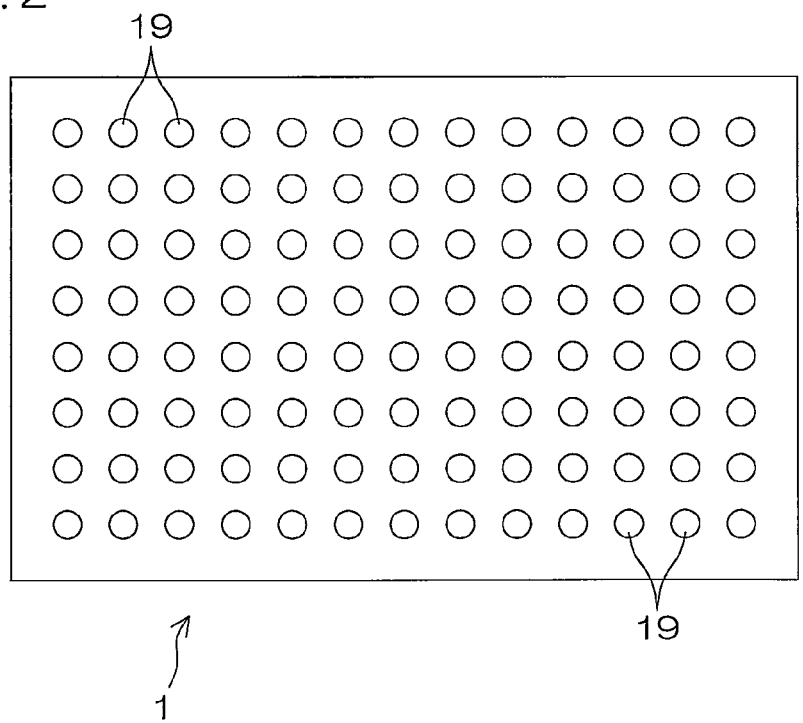
FIG. 2 is a diagram (a bottom plan view of a semiconductor device) showing the arrangement of external terminals in the semiconductor device.

FIG. 2 is a diagram (a bottom plan view of the semiconductor device 1) showing the arrangement of the external terminals 19 in the semiconductor device 1.

104 external terminals 19 are alignedly arranged on the lower surface of the semiconductor device 1 (the insulating substrate 14) in the form of a matrix with 8 rows and 13 columns. In other words, the 104 external terminals 19 are arranged in 4 rows by 9 columns and two annular arrays surrounding the same. In order to simplify the drawing, FIG. 2 assigns the reference numerals only to partial external terminals 19.

Figure 3:
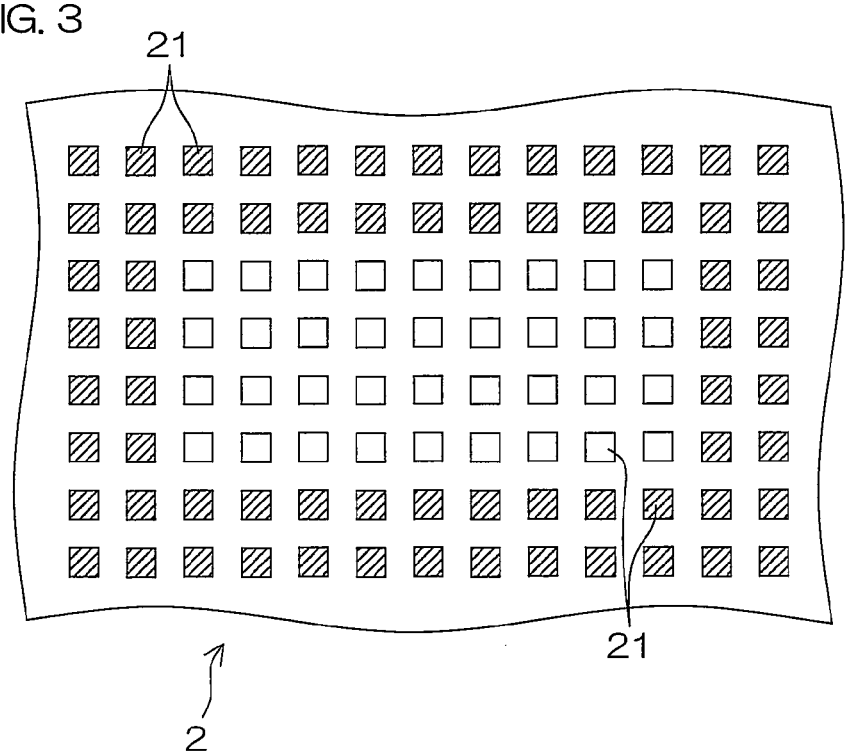
FIG. 3 is a plan view showing the arrangement of lands in a mounting substrate.

FIG. 3 is a plan view showing the arrangement of the lands 21 in the mounting substrate 2.

On the surface of the mounting substrate 2, 104 lands 21 are alignedly arranged in the form of a matrix with 8 rows and 13 columns, correspondingly to the external terminals 19 of the semiconductor device 1. In order to simplify the drawing, FIG. 3 assigns the reference numerals only to partial lands 21.

Figure 4:
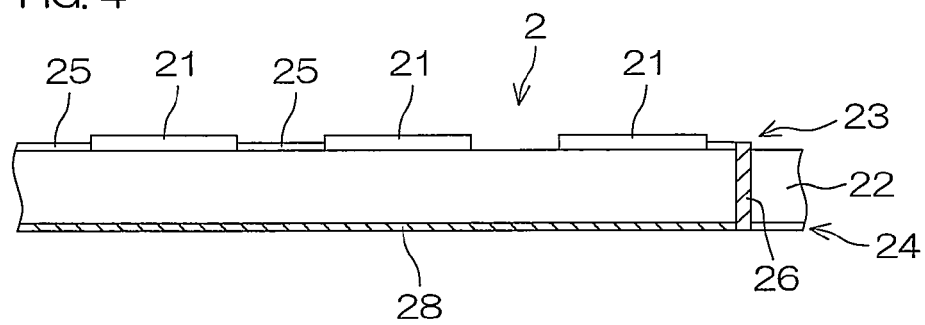
FIG. 4 is a sectional view of the mounting substrate.

FIG. 4 is a sectional view of the mounting substrate 2.

The mounting substrate 2 is made of a resin material such as epoxy resin, and includes an insulating layer 22 forming a substrate, a front wiring layer 23 stacked on a first surface (the front surface) of the insulating layer 22 and a rear wiring layer 24 stacked on a second surface (the rear surface) of the insulating layer 22.

Figure 5:
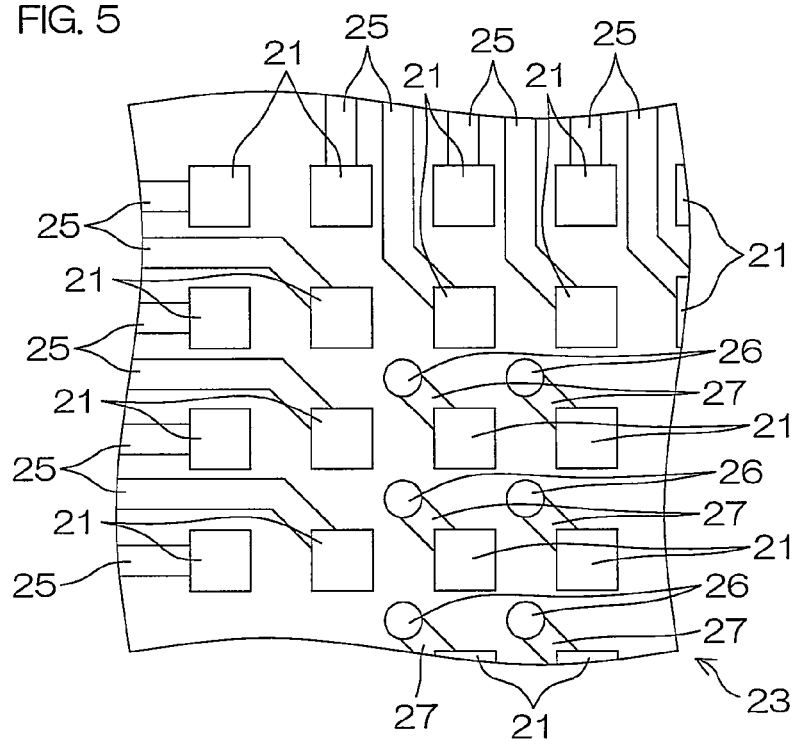
FIG. 5 is a plan view partially showing a first wiring layer.

FIG. 5 is a plan view partially showing the front wiring layer 23.

The 104 lands 21 and wires 25 connected to the lands (hatched in FIG. 3) forming two outermost annular arrays are formed on the front wiring layer 23.

The wires 25 are made of a metal such as copper. The wires 25 connected to the lands 21 set in the outer annular array respectively extend along the row direction (the right-and-left direction in the plane of FIG. 5) or the column direction (the vertical direction in the place of FIG. 5), and are extracted out of a region (hereinafter simply referred to as a "bonding region") of the mounting substrate 2 to which the semiconductor device 1 is bonded. The wires 25 connected to the lands 21 set in the inner annular array respectively are extracted out of the bonding region through the spaces between the wires 25 connected to the lands 21 set in the outer annular array respectively. The wires 25 are connected to a power supply circuit or the like provided on the mounting substrate 2 outside the bonding region.

As shown in FIGS. 4 and 5, vias 26 passing through the insulating layer 22 in the thickness direction are formed on the insulating layer 22 in association with 4 rows by 9 columns of the lands 21 (unhatched in FIG. 3) arranged inside the lands 21 forming the two outermost annular arrays. The 36 vias 26 are arranged on positions close to the lands 21 associated therewith respectively, to be alignedly arrayed in the form of a matrix with 4 rows and 9 columns, for example. Each via 26 can be formed by forming a via hole passing through the insulating layer 22 and filling up the via hole with a metallic material (copper, for example), for example.

Connecting wires 27 connecting the 4 rows by 9 columns of lands 21 and the vias 26 corresponding to the lands 21 respectively with one another are formed on the front wiring layer 23. The connecting wires 27 are made of a metal such as copper.

Figure 6:
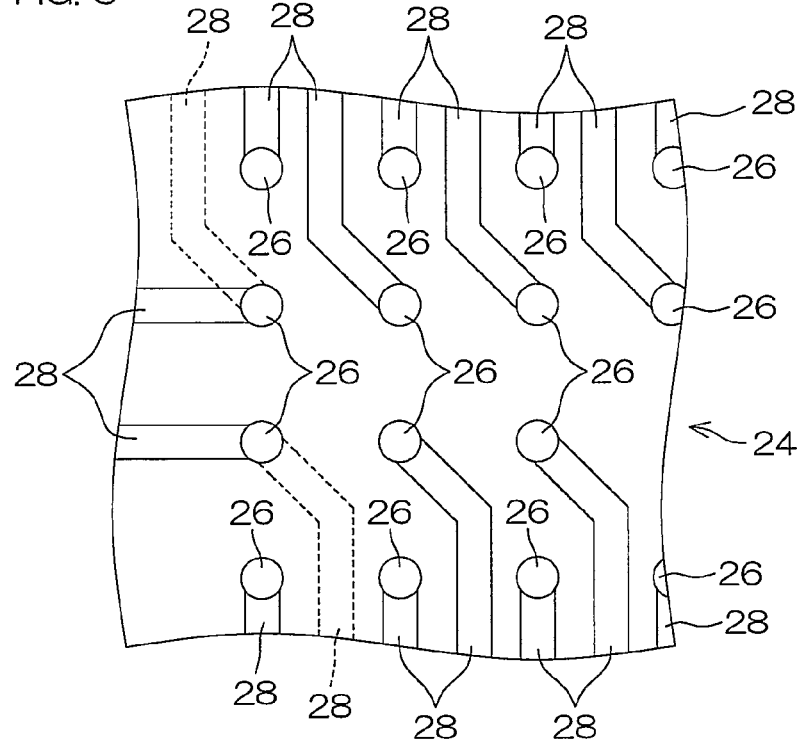
FIG. 6 is a bottom plan view partially showing a second wiring layer.
Figure 7:
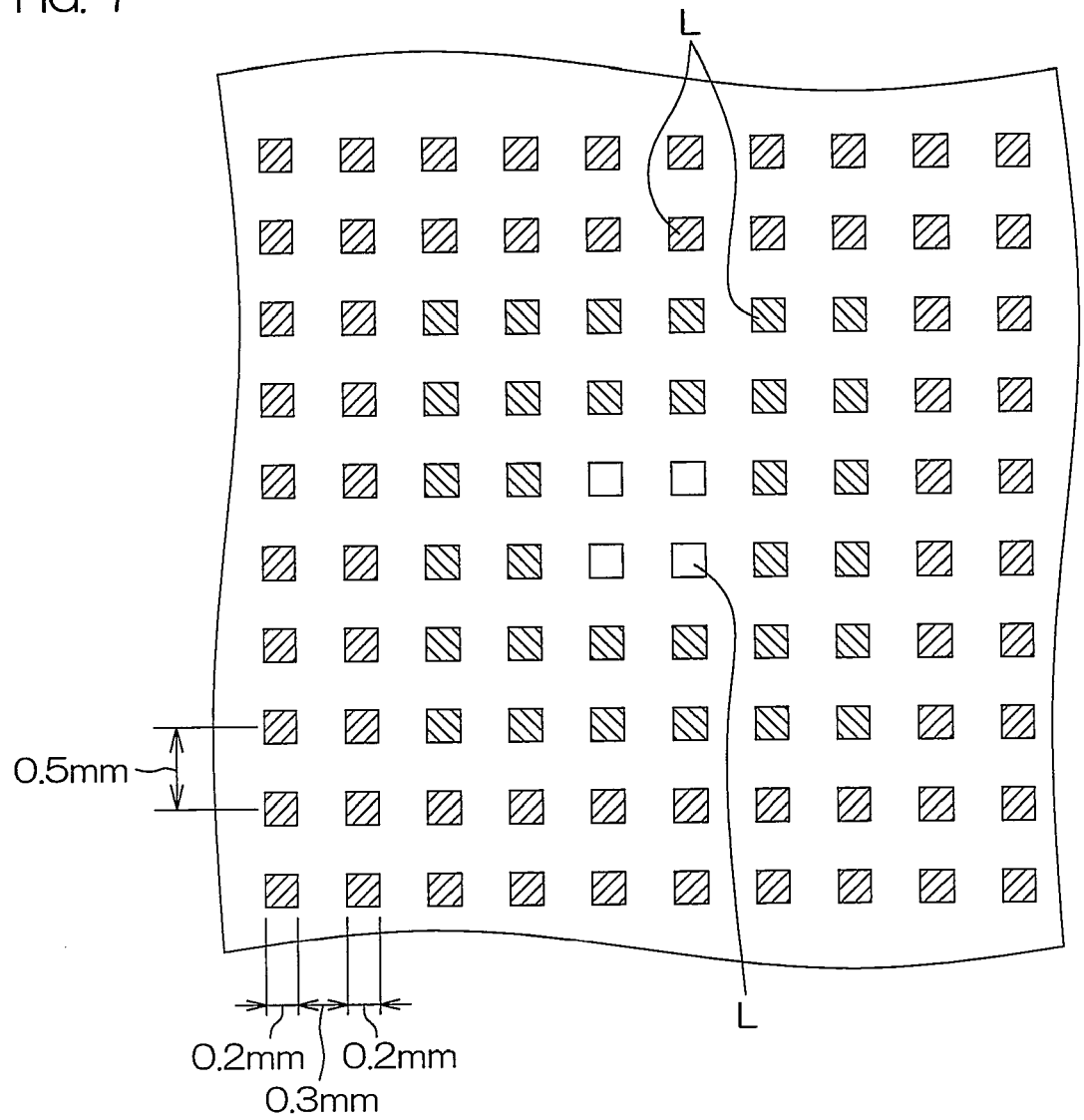
FIG. 7 is a diagram showing an example of the arrangement of lands in a conventional mounting substrate for 100 pins.

FIG. 6 is a bottom plan view partially showing the rear wiring layer 24.

Wires 28 connected to the vias 26 respectively are formed on the rear wiring layer 24. The wires 28 are made of a metal such as copper. The wires 28 connected to the vias 26 arrayed in the outer rows of the matrix with 4 rows and 9 columns extend outward from the vias 26 along the column direction (the vertical direction in the plane of FIG. 6). The wires 28 connected to the vias 26 arranged on both ends in the row direction (the right-and-left direction in the plane of FIG. 6) among the vias 26 arrayed in the two inner rows of the matrix with 4 rows and 9 columns extend outward from the vias 26 along the row direction. The wires 28 connected to the vias 26 arrayed in the two inner rows by 7 columns extend outward through the spaces between the wires 28 connected to the vias 26 arrayed in the outer rows. The wires 28 are connected to the power supply circuit or the like provided on the mounting substrate 2.

As hereinabove described, the 104 external terminals 19 are alignedly arrayed in the form of the matrix with 8 rows and 13 columns on the semiconductor device 1. On the mounting substrate 2 mounted with the semiconductor device 1, on the other hand, the 104 lands 21 are alignedly arrayed in the form of the matrix with 8 rows and 13 columns correspondingly to the 104 external terminals 19. The wires 28 electrically connected with the inner 4 rows by 9 columns of lands 21 respectively are formed on the rear wiring layer 24, while the wires 25 connected to the lands 21 set in the two annular arrays surrounding the 4 rows by 9 columns of lands 21 respectively are formed on the front wiring layer 23. In other words, the wires 25 and 28 connected to the 104 lands 21 respectively are dividedly formed on two layers, i.e., the front wiring layer 23 and the rear wiring layer 24.

The conventional mounting substrate for 100 pins requires at least three wiring layers, and hence the number of the wiring layers can be reduced in the mounting substrate 2 as compared with that in the conventional mounting substrate for 100 pins. The cost for a mounting substrate having a multilayer interconnection structure is increased as the number of wiring layers is increased, and hence the cost for the mounting substrate 2 can be reduced by reducing the number of the wiring layers.

The present invention may be embodied in other ways. For example, while the wires 28 connected to the vias 26 arranged on both ends in the row direction among the vias 26 arrayed in the two inner rows of the matrix with 4 rows and 9 columns respectively extend outward from the vias 26 along the row direction in the rear wiring layer 24, the wires 28 may be extracted in the column direction, as shown by broken lines in FIG. 6.

Such a structure has been employed that the external terminals 19 of the semiconductor device 1 are arrayed in 4 rows by 9 columns and set in two annular arrays surrounding the same while the lands 21 of the mounting substrate 2 are arrayed in 4 rows and 9 columns and set in two annular arrays surrounding the same correspondingly thereto. However, the external terminals 19 and the lands 21 are not restricted to the arrangement of 4 rows by 9 columns and the two annular arrays surrounding the same but may be arrayed in 4 rows by 10 columns and two annular arrays surrounding the same, i.e., 4 rows by $n$ columns ($n$: integer of not less than 5) and two annular arrays surrounding the same. Further, annularly arrayed external terminals 19 and lands 21 surrounding the outer sides thereof may be provided, and a wiring layer provided with wires connected with the lands 21 is additionally provided in this case.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-27953 filed with the Japanese Patent Office on Feb. 7, 2007, the disclosure of which is incorporated herein by reference.

The invention claimed is:

1. A mounting substrate mounted with a semiconductor device having external terminals alignedly arrayed in the form of a matrix, comprising:
   junctions arrayed on a surface to which the semiconductor device is opposed so that the external terminals are bonded thereto respectively; and
   wires connected to the junctions respectively and extracted out of a region to which the semiconductor device is bonded, wherein
   the wires connected to inwardly arrayed 4 rows by $n$ columns ($n$: integer of not less than 5) of the junctions respectively are formed on a first wiring layer, and
   the wires connected to the junctions set in two annular arrays surrounding the outer sides of the 4 rows by $n$ columns of junctions respectively are formed on a second wiring layer different from the first wiring layer.

2. An electronic apparatus including a mounting substrate and a semiconductor device having external terminals alignedly arrayed in the form of a matrix and surface-mounted on the mounting substrate, wherein
   the mounting substrate comprises:
   junctions arrayed on a surface to which the semiconductor device is opposed so that the external terminals are bonded thereto respectively; and
   wires connected to the junctions respectively and extracted out of a region to which the semiconductor device is bonded,
   the wires connected to inwardly arrayed 4 rows by $n$ columns ($n$: integer of not less than 5) of the junctions respectively are formed on a first wiring layer, and
   the wires connected to the junctions set in two annular arrays surrounding the outer sides of the 4 rows by $n$ columns of junctions respectively are formed on a second wiring layer different from the first wiring layer.

* * * * *